(12) United States Patent
Mecklenburg et al.

(10) Patent No.: US 9,150,950 B2
(45) Date of Patent: Oct. 6, 2015

(54) METHOD FOR PRODUCING INDEXABLE INSERTS

(75) Inventors: Arno Mecklenburg, Berlin (DE); Rainer Schneider, Berlin (DE); Rainer Michaelsen, Berlin (DE)

(73) Assignee: MSM KRYSTALL GBR, Berlin (DE)

(*) Notice: Subject to any disclaimer, the term of this patent is extended or adjusted under 35 U.S.C. 154(b) by 445 days.

(21) Appl. No.: 13/383,586

(22) PCT Filed: Jul. 14, 2010

(86) PCT No.: PCT/EP2010/060163
§ 371 (c)(1),
(2), (4) Date: Mar. 28, 2012

(87) PCT Pub. No.: WO2011/006940
PCT Pub. Date: Jan. 20, 2011

(65) Prior Publication Data
US 2012/0189775 A1    Jul. 26, 2012

(30) Foreign Application Priority Data

Jul. 14, 2009 (DE) .......................... 10 2009 033 192

(51) Int. Cl.
| C23C 14/00 | (2006.01) |
| C23C 14/34 | (2006.01) |
| C23C 14/18 | (2006.01) |
| C23C 14/06 | (2006.01) |

(52) U.S. Cl.
CPC ............. *C23C 14/0005* (2013.01); *C23C 14/06* (2013.01)

(58) Field of Classification Search
CPC ............. C23C 14/0005; C23C 14/228; C23C 14/3407; C23C 14/18; C23C 16/30

USPC ....................................... 204/192.1; 427/337
See application file for complete search history.

(56) References Cited

U.S. PATENT DOCUMENTS

| 3,289,271 | A | * | 12/1966 | Stier ............................ 407/113 |
| 5,250,367 | A | * | 10/1993 | Santhanam et al. .......... 428/698 |
| 5,584,045 | A |   | 12/1996 | Tanabe et al. |
| 5,731,046 | A | * | 3/1998  | Mistry et al. .................. 427/553 |
| 5,750,193 | A | * | 5/1998  | Nass et al. ............... 427/213.31 |
| 5,869,133 | A | * | 2/1999  | Anthony et al. ........... 427/249.8 |
| 2001/0041107 | A1 | * | 11/2001 | Liu et al. ...................... 407/119 |

(Continued)

FOREIGN PATENT DOCUMENTS

| EP | 0 381 509 A1 | 8/1990 |
| EP | 2 003 194 A2 | 12/2008 |

(Continued)

OTHER PUBLICATIONS

Rich, D.J., et al., "Spalling resistance of physical vapor deposited and chemical vapor deposited TiN coated carbide indexable inserts in a short duration milling test". J. Vac. Sci. Technol. A, vol. 4, No. 6, Nov./Dec. 1986, pp. 2759-2762.*

(Continued)

*Primary Examiner* — Bret Chen
(74) *Attorney, Agent, or Firm* — Dickinson Wright PLLC

(57) ABSTRACT

Method for the production of indexable inserts, which exhibits the following:
Deposition of a layer of cutting tip material forming the indexable inserts (40) by means of a PVD method on a dissolvable profiled substrate (10), and—dissolving of the substrate to produce the form of free-standing parts as indexable inserts.

31 Claims, 3 Drawing Sheets

(56) References Cited

U.S. PATENT DOCUMENTS

| | | |
|---|---|---|
| 2002/0007796 A1* | 1/2002 | Gorokhovsky ......... 118/723 ER |
| 2004/0076856 A1 | 4/2004 | Hugosson |
| 2004/0219395 A1* | 11/2004 | Imamura et al. ............... 428/698 |
| 2005/0183893 A1* | 8/2005 | Sjogren et al. ................. 175/426 |
| 2005/0191482 A1* | 9/2005 | Liu ................................. 428/323 |
| 2006/0204757 A1* | 9/2006 | Ljungberg .................... 428/408 |
| 2009/0148599 A1* | 6/2009 | Ramm et al. ................ 427/255.5 |
| 2009/0232611 A1* | 9/2009 | Omori et al. ................... 407/114 |
| 2009/0274525 A1* | 11/2009 | Omori et al. ................... 407/119 |
| 2009/0311297 A1 | 12/2009 | Hontsu et al. |
| 2013/0330137 A1* | 12/2013 | Mecklenburg ................ 407/113 |

FOREIGN PATENT DOCUMENTS

| | | |
|---|---|---|
| GB | 2179678 A | 3/1987 |
| JP | 63-267166 A | 11/1988 |
| WO | WO 97/07257 A1 | 2/1997 |
| WO | WO 2006/118511 A1 | 11/2006 |
| WO | WO 2008/115550 A1 | 9/2008 |

OTHER PUBLICATIONS

Ramakrishna, V.V., et al., "Analysis of Indexable Insert Cutting Tool with Reverse Engineering". International Journal of Engineering Research & Technology (IJERT), ISSN:2278-0181 vol. 1 Issue 8, Oct. 2012, pp. 1-4.*

Office Action dated Jun. 25, 2013, to counterpart Chinese Patent Application 201080040853.8.

German Office Action corresponding to DE 10 2009 033 192.1 dated Feb. 2, 2010.

English Translation of German Office Action corresponding to DE 10 2009 033 192.1 dated Feb. 2, 2010.

International Search Report (PCT/ISA/210) issued on Nov. 4, 2010, by European Patent Office as the International Searching Authority for International Application No. PCT/EP2010/060163.

* cited by examiner

METHOD FOR PRODUCING INDEXABLE INSERTS

TECHNICAL FIELD

The invention relates to a method for producing indexable inserts by physical gas phase deposition (English: physical vapor deposition, PVD for short) of cutting materials on dissolvable profiled substrates.

BACKGROUND

Usually, indexable inserts are produced by powder-metallurgical means or by sintering, whereby WC/Co (wolfram carbide-cobalt, in general "hard metal") is an important base material. Frequently, indexable inserts are provided by means of physical (PVD) or chemical gas phase deposition (English: chemical vapor deposition, CVD for short) with hard, abrasion-resistant and corrosion-resistant coatings to reduce their wear and tear and/or to make possible higher machining speeds and better cutting qualities.

The PVD method includes, i.a., thermal evaporation, electron beam evaporation, (English: electron beam evaporation), laser beam evaporation (English: pulsed laser deposition, pulsed laser ablation), arc evaporation (English: arc evaporation, Arc-PVD), molecular beam epitaxy (English: molecular beam epitaxy), sputtering, ion-beam-supported deposition (English: ion beam assisted deposition, IBAD) and ion plating. The powder-metallurgical production of actual indexable inserts is associated with various drawbacks; in this case of hard metal, these are primarily the following:

- To achieve the very small grain sizes (for the hard material phase, <0.5 µm) that are desirable with respect to the mechanical wear resistance, fine-grained starting powder corresponding to high expense have to be produced and handled as much as possible under oxygen-free conditions.
- The production of pore-free sintered bodies with homogenous structures is often difficult and not fully successful, and frequently requires additional technical expense such as hot isostatic pressing (English: hot isostatic pressing, HIP for short).
- During sintering, grain growth results, by which technically desirable grain sizes in the nanometer range are not achievable.
- Numerous promising, in particular high-temperature, material systems (e.g., alloys) cannot be fabricated or cannot be produced economically in the form of massive parts because of their high solidus temperatures.
- The setting of special textures, such as nanometer-multilayer systems, is impossible with the powder-metallurgy agents corresponding to the state of the art.

The physical gas phase deposition is known for coating but not for production of indexable inserts. Indexable inserts are usually produced from hard metal by means of a sintering method. It is known that PVD or CVD methods are suitable to deposit amorphous or less crystallized as well as nanocrystalline hard material systems. It is also known to suitably crystallize such layers by heat treatment. Because of the low deposition rates, the physical gas phase deposition is used namely for producing thin layers, but not for producing massive parts such as indexable inserts. If physical gas-phase coatings are run at low process pressures, the latter behave as "line-of-sight methods," i.e., undercuts of the substrate are not coated or are coated to only a small extent, which in the coating of tools often represents a serious drawback that makes it necessary, for example, to control the movement of the tools to be coated during layer deposition.

There is a need for as economical a production of indexable inserts as possible with especially fine ("nanocrystalline") uniform and, if necessary, high-grade anisotropic structures. In this case, the weakening of the powder metallurgy cited under "State of the Art" and the sintering are to be completely avoided. In addition, the parallel production of as many close-to-final-geometry indexable inserts as possible is to be made possible in a simple way and is to be economical.

SUMMARY

One aspect of the invention relates to the use of a method for physical vapor deposition (PVD method) for the production of a base body of an indexable insert by depositing a layer with a thickness that essentially corresponds to the thickness of the indexable insert.

A method for producing indexable inserts is disclosed. According to one example of the invention, close-to-final-geometry indexable inserts are produced by a profiled substrate being coated by means of physical gas phase deposition, after which the substrate is chemically or electrochemically dissolved. This makes possible the production of indexable inserts that consist of materials that cannot be sintered; in addition, structures (nanocrystalline and multilayer, including nanoscale multilayer systems) are available that cannot be obtained with conventional methods. The coating of the substrate before the deposition of the actual cutting material also makes possible the production of coated indexable inserts in an especially simple way. Due to the excellent scalability of many PVD methods, it is possible according to the invention to produce a large number (up to several tens of thousands) of cutting tips (indexable inserts) in parallel on known systems: the cutting tips are pressed regularly.

As an example of the invention, a method for simultaneous production of a number of tip-like elements, in particular indexable inserts, is disclosed. The method comprises: the preparation of a structured substrate, whereby the structure of the substrate secures areas on which the tip-like elements are produced; the deposition of a layer forming the tip-like elements by means of a PVD method, by means of which material is conveyed from a target along a coating direction to the substrate in order to form the layer; and the dissolving of the substrate, by which tip-like elements are separated, whereby the substrate is structured in such a way that between those areas of the substrate on which the tip-like elements are deposited, there are substrate surfaces that are oriented parallel to the coating direction or that form an undercut, so that on those substrate surfaces, no material or negligibly little material from the target is deposited.

BRIEF DESCRIPTION OF THE FIGURES

The following figures and the further description are to aid in better understanding the invention. Further details, variants, and further developments of the idea of the invention are explained based on the figures, which pertain to a special selected example. The elements in the figures are not necessarily defined as limitations; rather, the emphasis is on depicting the principle of the invention. In the figures, the same reference numbers refer to corresponding parts.

DETAILED DESCRIPTION

Figure 1:
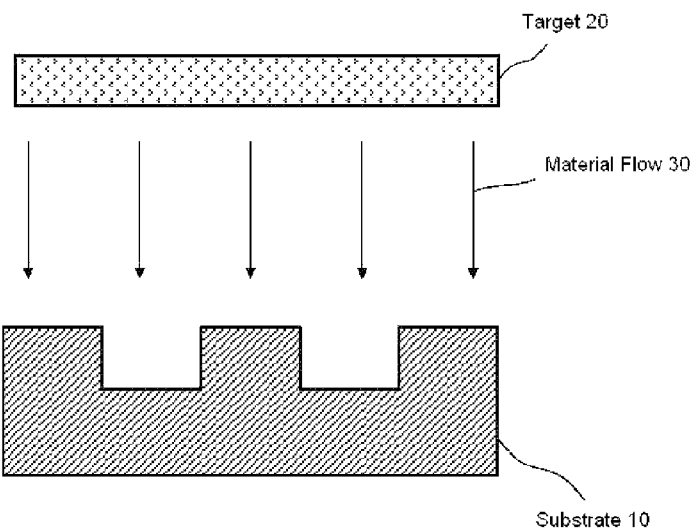
FIG. 1 illustrates the principle of the physical gas phase deposition (PVD) on a substrate based on a diagrammatically outlined arrangement.

FIG. 1 illustrates in a simplified way the principle of the process of the physical gas phase deposition (PVD). A substrate 10 that is to be coated is arranged together with a so-called target 20 (general material source) in a process environment. Based on the respective PVD method, the layer-forming particles are dissolved out from the target 10 [sic] and thus a gas or a (e.g., ionized) plasma is produced; the particles from the target 20 are transported to the substrate 10 (see FIG. 1: Material stream 30) and condense on the substrate 10, by which the PVD layer is formed. Depending on the PVD process, the material particles from the target 20 can also react with atoms or molecules from the process atmosphere, before they condense on the substrate 10 and form a PVD layer. For example, a layer that consists of titanium nitride can be produced from a titanium target, whereby the titanium particles that are dissolved out from the target 20 react in a nitrogen atmosphere to form titanium nitride. Different PVD methods are known and thus are not discussed in detail. In the embodiments described, various PVD methods can be used. Good experimental results were achieved by, e.g., sputtering.

Figure 2:
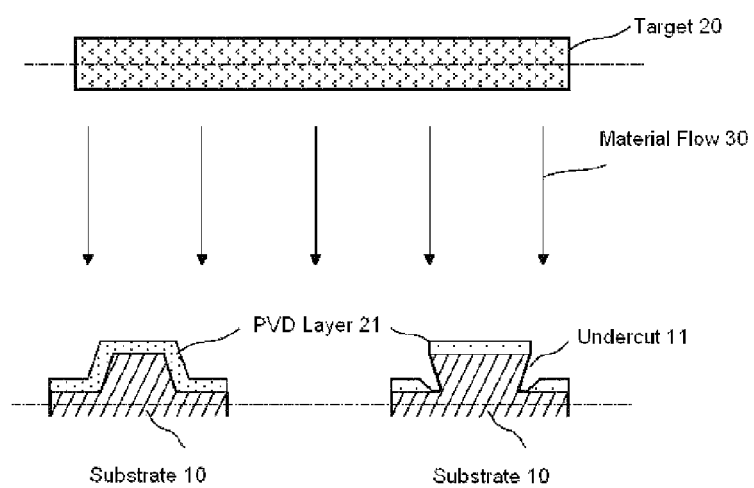
FIG. 2 illustrates, based on a simple example, how the PVD layer can be interrupted with an undercut on the substrate.

FIG. 2 illustrates a property of the physical gas phase deposition that is generally considered disadvantageous. A material deposition takes place only in the direction of material transport from the target 20 to the substrate 10, so that the latter is not coated behind undercuts (see FIG. 2, undercut 11) in the substrate. In addition, no material or negligibly little material is deposited on the surfaces that are parallel to the direction of the material transport (direction of the layer thickness growth).

Figure 3:
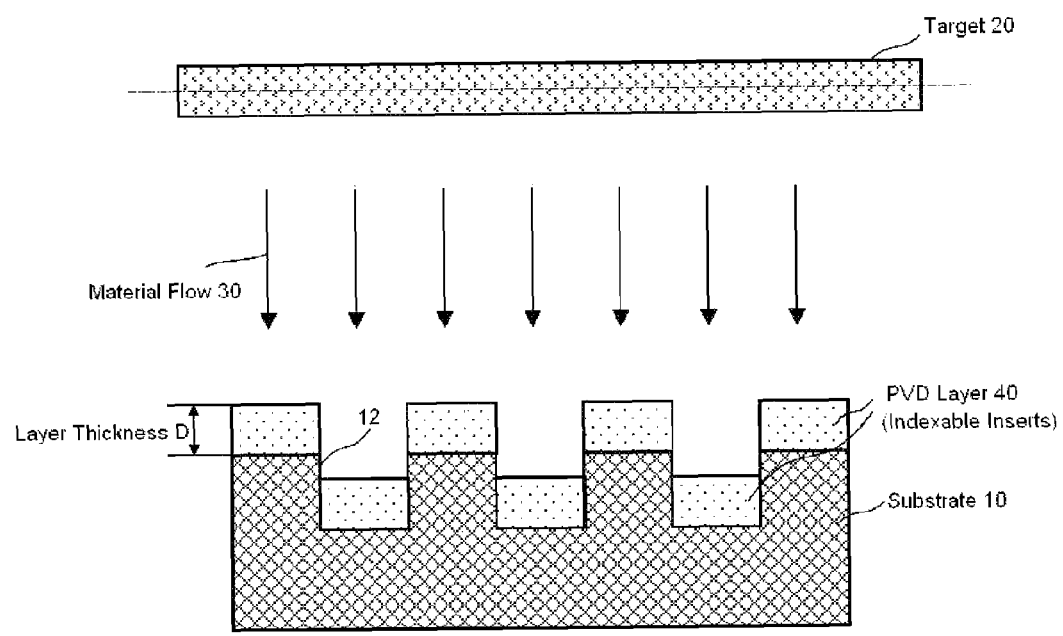
FIG. 3 illustrates a structured substrate with a thick PVD layer for the production of a large number of indexable inserts.

According to one example of the invention, a profiled (i.e., structured corresponding to the target form of the indexable inserts) substrate 10, for example that consists of an aluminum-titanium alloy, is coated by means of a method of the physical gas phase deposition (see FIG. 3: PVD layer 40). As explained above with reference to FIG. 2, at fairly low pressure, the substrate 10 is coated highly unevenly because of its profile: On the undercuts or surfaces that are perpendicular to the plane in which the target lies, no material or very little material is deposited. If the substrate 10 is now chemically (e.g., by etching) or electrochemically dissolved (i.e., the substrate 10 is removed), the deposited layer 40 is obtained in the form of discrete, free-standing parts that in the case of suitable forming of the substrate can already have the form of the indexable inserts to be produced. The substrate can consist of multiple parts that are detachably connected to one another (screwed), so that only one part of the substrate 10 has to be dissolved. The other part(s) of the substrate 10 can be mechanically removed (e.g., by loosening the screws). For example, a substrate can consist of an insert-like base body and a mask fastened thereto, whereby the mask openings determine the later form of the cutting tips. After the deposition of the cutting tips, the part of the substrate that forms the mask can be from the base body of the substrate so that only the base body of the substrate has to be dissolved.

Because of the forming of the substrate, the forms of the individual parts already have their final geometry (or are very close to the final geometry), which is referred to as "close-to-final-geometry." A post-treatment of the form is not necessary or is necessary to an only very small extent. In this way, a large number (several thousand) of indexable inserts can be produced simultaneously. The large number of the indexable inserts, which can be produced simultaneously with the method according to the invention, compensate for the drawback that the production of correspondingly thicker PVD layers (greater than 500 µm, and even greater than 1,000 µm) lasts a corresponding long time (up to 24 hours or longer).

One example of the above-described method according to the invention is depicted in FIG. 3. The individual areas of the substrate 10, on which the indexable inserts are deposited, are arranged offset to one another in height. On the surfaces that are normally on the (in this example, horizontal) plane, in which the substrate 10 will lie—as explained above—material (i.e., negligibly little material) is deposited, so that the indexable inserts 40 are already separated after the substrate dissolves.

The desired grain size and absence of stress can be provided by heat treatment according to known methods under a cover gas or in a vacuum.

According to another example of the invention that is shown in FIGS. 4a-d, the substrate 10 is coated before the deposition of the subsequent indexable inserts (see FIG. 4c, PVD layer 40a) according to a known method (see FIG. 4c, CVD layer 41), for example by means of chemical gas phase deposition (English chemical vapor deposition, CVD for short) with several µm of titanium diboride ($TiB_2$), whereby the method for dissolving the substrate 10 is suitably selected in such a way that only the substrate 10 is dissolved, but the base material (PVD layer 40a) and the coating (CVD layer 41) are not attacked or are only slightly attacked. In this way, the free-standing parts 40a including the CVD coating 41 are obtained, whereby the side facing the target 20 remains uncoated, which is advantageous when the indexable inserts 40a are to be soldered onto carriers.

According to another example of the invention, multiple sources (referred to in many PVD methods as targets) that consist of various materials are used alternately to produce indexable inserts that consist of multilayer cutting materials, whereby, for example, a first target can consist of tantalum and a second target can consist of glassy carbon. In this case, the layer thickness is selected in such a way that alternating layers—for example that consist of tantalum carbide (TaC) and ($sp^2$-hybridized) carbon—are produced by means of a heat treatment by diffusion.

The advantages of the physical gas phase deposition are thus used, as is also the generally disadvantageous property of this method of not coating undercuts or coating them only a little. In addition, multilayer indexable inserts, even those with layer thicknesses in the nanometer range, can be produced in a simple way with the new method. In addition to especially high hardness and temperature stability, such multilayer systems can also be extraordinarily viscous, far more viscous than the pure base materials of the individual layers, which is advantageous for the use in indexable inserts, primarily in continuous cutting. Also, relative to their mechanical properties, multilayer systems are inherently anisotropic, which can be used in indexable inserts since their mechanical stresses are likewise anisotropic to a very large extent.

In addition, scalability in surface area is exploited: Even a method that is characterized by low rates, such as, e.g., cathode sputtering, is only seemingly unsuitable for economical production of solid material. When used according to the invention, PVD units (e.g., cathode sputtering units) with many square meters of substrate surface area allow the production of 10,000 indexable inserts of commercial geometry per day.

Various important aspects of the method according to the invention are summarized below once again (without claim to completeness).

Figure 4:
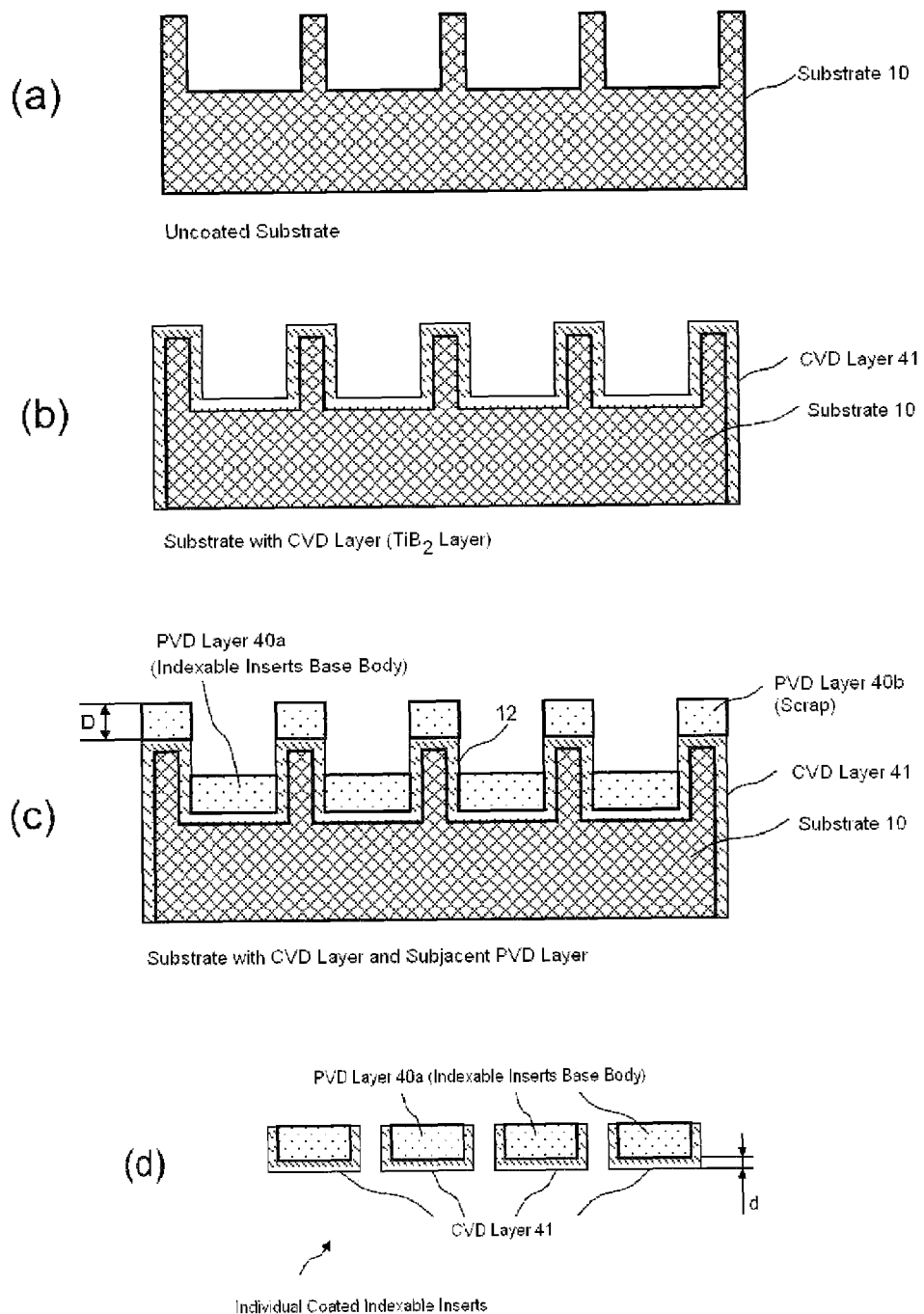
FIG. 4 illustrates a structured substrate with a thin CVD layer and a thick PVD layer applied thereto for the production of a number of coated indexable inserts.

One embodiment of the method according to the invention for simultaneous production of a large number of tip-like elements (such as, e.g., indexable inserts that consist of hard metal) comprises the following steps:

Preparation of a structured substrate 10 (see FIG. 4*a*);
Deposition of a layer 40*a*, 40*b* that forms the tip-like hard metal elements 40' by means of a PVD method;
Dissolving of the substrate 10, by which tip-like hard metal elements 40' are separated.

In this case, the substrate is structured in such a way that between the areas of the substrate 10 on which the tip-like hard metal elements are deposited, there are substrate surfaces 12 that are oriented parallel to the coating direction or that form an undercut in the substrate 10, so that no (or negligibly little) material from the target 20 is deposited on the substrate surfaces 12.

In this case, the deposition process can be controlled in such a way that the material of the deposited PVD layer 40, 40*a*, 40*b* is present completely or primarily in nanocrystalline form, by which the hardness and the viscosity of the deposited layer (i.e., the cutting tips) can be considerably increased. In addition, the deposited PVD layer 40, 40*a*, 40*b* can be subjected to the relaxing of the internal stresses and/or to setting the microstructure of a heat treatment.

Optionally, before the deposition of the tip-like hard metal elements 40, 40*a* by means of PVD, the substrate 10 can be coated with another layer 41 (e.g., that consists of titanium diboride, $TiB_2$), for example by means of CVD. After the substrate 10 is removed, the additional layer 41 remains on the then deposited PVD layer 40, 40*a*. In this way, indexable inserts coated with, e.g., $TiB_2$ can be produced.

For the production of tip-like elements, which are suitable as, e.g., indexable inserts and which have an especially high temperature stability as well as an especially high viscosity, a cutting material that contains, e.g., tantalum, carbon, wolfram or rhenium can be deposited according to known PVD methods. In this case, the composition of the cutting material can be selected in such a way that by heat treatment of the free-standing parts, a multiphase structure can be obtained, which contains more than 70% by volume of carbide as well as a ductile wolfram-rhenium phase. In this case, the ductile wolfram-rhenium phase contains between 10 and 28 at. % of rhenium, in particular between 22 and 28 at. % of rhenium. The above-mentioned multiphase structure can contain multiple carbide phases, of which one consists of tantalum carbide(s) (TaCx) and another consists of wolfram carbide ($W_2C$). The cutting material can be doped in addition with less than 5 at. % of chromium and/or vanadium (total).

According to another example of the method according to the invention, a large number of tip-like elements (e.g., cutting inserts) are produced by physical gas phase deposition on a substrate 10, whereby multiple material sources (targets) are used in the PVD method used in order to produce multilayer PVD layers. In this case, a target can primarily consist of carbon, and at least one additional source can primarily consist of one or more carbide producers. When using a sputtering method for PVD, the primarily carbon-containing sputtering target can consist of glassy carbon. As carbide producers, one of the following materials or any combination of the following materials can be used: wolfram, titanium, zirconium, hafnium, tantalum, chromium, vanadium, and niobium. In this case, the layer thicknesses can be proportioned in such a way that the latter are produced with alternating layers that consist of carbide and $sp^2$-hybridized carbon by heat treatment of the tip-like elements. The carbide layers can be thicker than the carbon layers in the finished tip-like elements (indexable inserts). The mean thickness of carbide layers is, for example, less than 0.6 µm. When using multiple carbide producers, multiple carbide phases can be obtained, of which at least one is to be present in nanocrystalline form.

The separated tip-like elements (indexable inserts) can be used in free-standing form or soldered (or welded) onto carriers that consist of hard metal or high-speed steel, and then can be used as cutting tools. The individual tips can be applied to the above-mentioned carrier even before a heat treatment and soldered or welded to the latter, whereby the soldering or welding is carried out with the heat treatment in a work step.

Suitable materials for the substrate 10 are, e.g., aluminum or titanium or alloys that contain aluminum and/or titanium. The dissolving of the substrate 10 can be carried out by chemical means (e.g., etching) or by electrochemical means (e.g., anodization). As etching agents, e.g., sodium hydroxide or caustic potash as well as various mineral acids are considered. The surface of the substrate can be prepared in situ by the substrate being inserted before the PVD layer itself as a cathode and being surface-sputtered.

The invention claimed is:

1. A method for the production of indexable inserts comprising:
   depositing a layer of cutting tip material by means of a PVD method on a dissolvable profiled substrate to the thickness (D) of the desired indexable inserts, and
   dissolving the dissolvable profiled substrate to produce free-standing parts as indexable inserts;
   wherein the free-standing parts have a thickness (D) that is greater than 50 µm.

2. The method according to claim 1, wherein the deposited cutting tip material is present completely or primarily in nanocrystalline form.

3. The method according to claim 1, further comprising:
   heat treating of the indexable inserts for relaxing internal stresses or for setting the microstructure or both.

4. The method according to claim 3, further comprising applying the free-standing parts before the heat treatment onto carriers that contain hard metal or high-speed steel and are soldered or welded to the latter, whereby the soldering or welding is carried out with the heat treatment in one step.

5. The method according to claim 1, wherein the PVD method comprises a cathode sputtering.

6. The method according to claim 1, wherein the cutting tip material is a known cutting material.

7. The method according to claim 1, wherein the cutting material contains one or more of tantalum, carbon, tungsten, and rhenium.

8. The method according to claim 7, wherein the composition of the cutting material is selected in such a way that by heat treatment of the free-standing parts, a multiphase structure can be obtained, which contains >70% by volume of carbide as well as a ductile tungsten-rhenium phase.

9. The method according to claim 8, wherein the ductile tungsten-rhenium phase contains between 10 and 28 at. % of rhenium.

10. The method according to claim 8, wherein the ductile tungsten-rhenium phase contains between 22 and 28 at. % of rhenium.

11. The method according to claim 8, wherein the multi-phase structure contains multiple carbide phases, of which one contains TaC and another contains $W_2C$.

12. The method according to claim 8, wherein the cutting material is doped in addition with a total of less than 5 at. % of chromium or vanadium or both.

13. The method according to claim 1, wherein by using multiple sources, multi-layer free-standing parts are produced.

14. The method according to claim 13, wherein at least one source contains primarily carbon, and at least one other source contains primarily one or more carbide producers.

15. The method according to claim 14, wherein the primarily carbon-containing sputter target contains glassy carbon.

16. The method according to claim 14, wherein as carbide producers, tungsten or titanium or zirconium or hafnium or tantalum or chromium or vanadium or niobium or a combination thereof are used.

17. The method according to claim 14, wherein the layer thicknesses are proportioned in such a way that by heat treatment of the free-standing parts, the latter are obtained with alternating layers that consist of carbide and $sp^2$-hybridized carbon.

18. The method according to claim 17, wherein the carbide layers in the finished parts are thicker than the carbon layers.

19. The method according to claim 18, wherein the mean thickness of the carbide layers is less than 0.6 μm.

20. The method according to claim 14, wherein multiple carbide producers are used in such a way that multiple carbide phases are obtained, of which at least one is present in nanocrystalline form.

21. The method according to claim 1, further comprising depositing one or two layer(s) that are thin compared to the thickness of the free-standing part and that contain known hard material by cathode sputtering before or after the depositing of the actual cutting tip material, or both, so that after the dissolving, free-standing parts are obtained which is/are coated on one or two sides (above/below) with the known hard material.

22. The method according to claim 1, further comprising coating the dissolvable profiled substrate with a known hard material before the depositing of the actual cutting tip material, so that after the dissolving of the substrate, free-standing parts are obtained, which are coated on multiple sides with the known hard material.

23. The method according to claim 1, further comprising soldering the free-standing parts onto carriers that contain hard metal or high-speed steel.

24. The method according to claim 1, wherein the substrate contains aluminum or titanium or aluminum alloys or titanium alloys.

25. The method according to claim 24, wherein the dissolving is carried out by chemical or electrochemical means.

26. The method according to claim 25, wherein mineral acids or sodium hydroxide or caustic potash are used as etching agents to dissolve the substrate.

27. The method according to claim 1, further comprising preparing the surface of the substrate in situ by inserting the substrate before the PVD layer itself as a cathode and surface-sputtering.

28. The method according to claim 1, wherein the free-standing parts have a thickness (D) that is greater than 100 μm.

29. The method according to claim 1, wherein the free-standing parts have a thickness (D) that is greater than 250 μm.

30. A method for simultaneous production of a large number of tip elements comprising:
preparing a structured substrate, wherein the structure of the substrate secures areas on which the tip elements are produced;
depositing a layer forming the tip elements by a PVD method, wherein material is conveyed from a target along a coating direction to the substrate in order to form the layer;
dissolving the substrate, wherein tip elements are separated,
coating of the substrate with another layer, in particular by means of a CVD method before the deposition of the layer that forms the tip elements
wherein the substrate is structured in such a way that between those areas of the substrate on which the tip elements are deposited, there are substrate surfaces that are oriented parallel to the coating direction or that form an undercut, so that on those substrate surfaces, no material or negligibly little material from the target is deposited.

31. The method according to claim 30, wherein the thickness of the elements corresponds essentially to the thickness of a layer that is deposited by means of a PVD method.

* * * * *